United States Patent [19]

Iwase

[11] Patent Number: 5,446,700

[45] Date of Patent: Aug. 29, 1995

[54] DECODER CIRCUIT HAVING CMOS INVERTER CIRCUITS

[75] Inventor: Taira Iwase, Kawasaki, Japan

[73] Assignee: Kabushiki Kaisha Toshiba, Kawasaki, Japan

[21] Appl. No.: 214,158

[22] Filed: Mar. 17, 1994

Related U.S. Application Data

[63] Continuation of Ser. No. 979,079, Nov. 19, 1992, abandoned.

[30] Foreign Application Priority Data

Nov. 12, 1991 [JP] Japan ................... 3-305974

[51] Int. Cl.$^6$ .............................. G11C 11/34
[52] U.S. Cl. ................ 365/230.06; 365/230.03; 365/230.01; 326/104; 326/105
[58] Field of Search ............ 365/230.06, 230.03, 365/189.08, 189.11, 204; 307/449, 451; 326/104, 105

[56] References Cited

U.S. PATENT DOCUMENTS

| 4,723,229 | 2/1988 | Hartgring et al. | 365/230.03 |
| 4,837,747 | 6/1989 | Dosaka et al. | 365/230.06 |
| 4,843,261 | 6/1989 | Chappell et al. | 365/230.06 |
| 4,939,696 | 7/1990 | Katsuo et al. | 365/230.06 |
| 4,951,259 | 8/1990 | Sato et al. | 365/230.06 |
| 4,972,373 | 11/1990 | Kim et al. | 365/230.03 |

FOREIGN PATENT DOCUMENTS 59-155954  9/1984  Japan .
02226595  9/1990  Japan .

Primary Examiner—David C. Nelms
Assistant Examiner—Vu Le
Attorney, Agent, or Firm—Banner & Allegretti, Ltd.

[57] ABSTRACT

A decoder circuit comprises a plurality of input word select lines, a plurality of input block select lines, a main decoder, and a plurality of CMOS inverters each having a first power source node, a second power source node applied with a predetermined potential, an input node connected to one of the input word select lines, and a decoder output line. The main decoder activates/deactivates each CMOS inverter by applying an output signal to the first power source node of each CMOS inverter, thereby driving each decoder output line according to the logic level of the respective input word select line when the CMOS inverter is activated. The decoder circuit also includes means for controlling the logic level of the output block select lines according to the logic levels of the input block select lines.

1 Claim, 4 Drawing Sheets

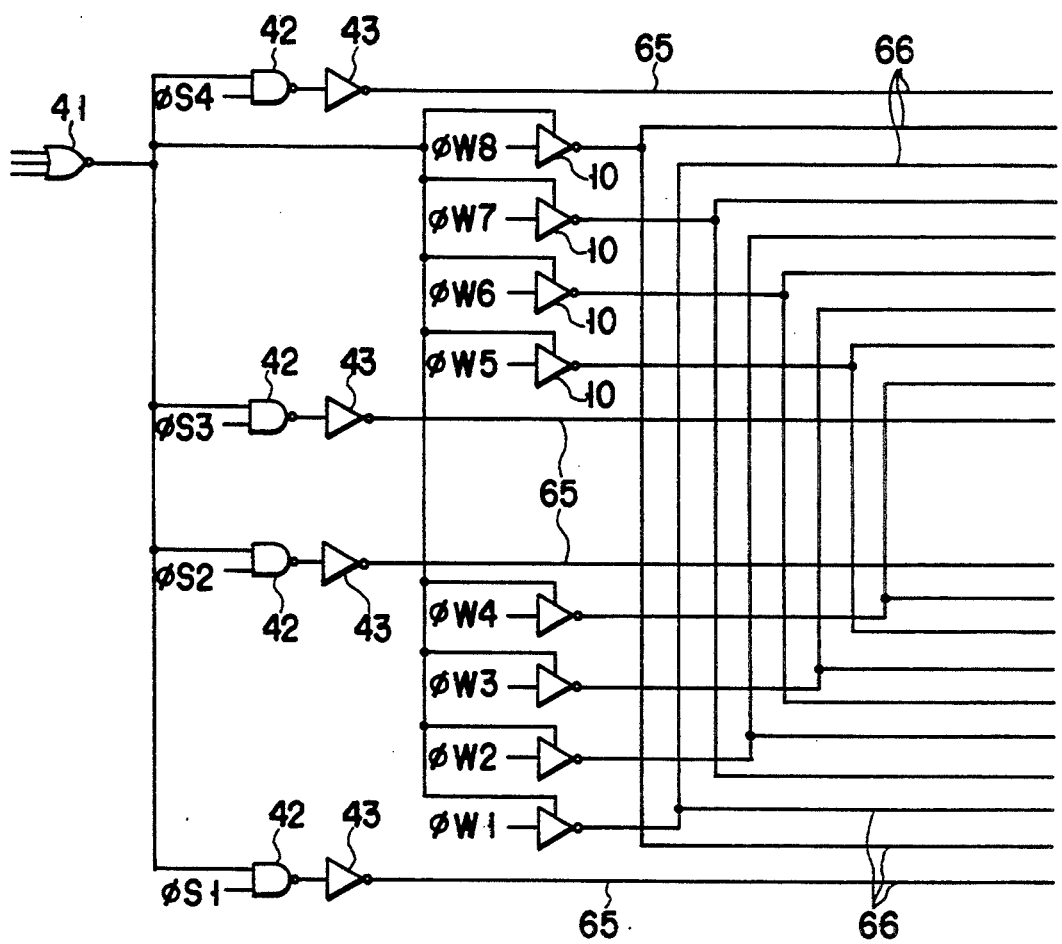
F I G. 5
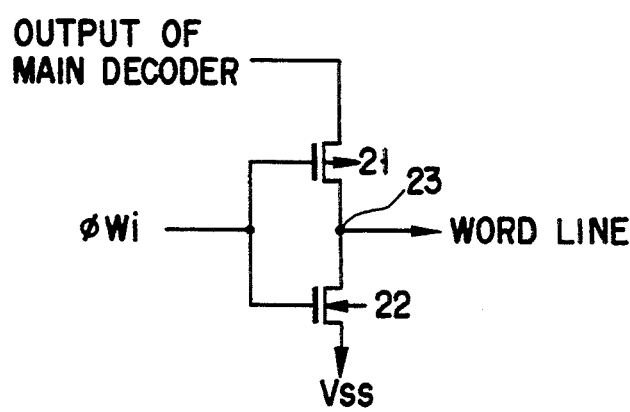
F I G. 6

DECODER CIRCUIT HAVING CMOS INVERTER CIRCUITS

This application is a continuation of application Ser. No. 07/979,079, filed Nov. 19, 1991 now abandoned.

BACKGROUND OF THE INVENTION

1. Field of the Invention

This invention relates to a decoder circuit for decoding an address signal in a semiconductor memory device, and more particularly to a decoder circuit having a decoded output driving CMOS inverter circuits.

2. Description of the Related Art

FIG. 1 is a circuit diagram showing part of a cell array and part of a memory cell array of the conventional mask ROM (read only memory). 61 indicates memory cells each constructed by an enhancement or depletion MOS transistor corresponding to write data "1" or "0" 62 indicates memory cell blocks each having a plurality of memory cells 61 (in this example, eight memory cells) connected in a form of a NAND logic circuit, 63 indicates block selecting enhancement MOS transistors, 64 indicates block selecting depletion MOS transistors, 65 indicates block selecting lines, 66 indicates word lines, 67 indicates a main row decoder constructed by a NAND gate, and 68 indicates a block selecting NOR gate to which one of block selection signals $\phi$si (i=1, 2, 3, 4) and an output of the main row decoder are input. Further, 69 indicates word line selecting NOR gates each of which is supplied with one of word line selection signals $\phi$wi (i=1, 2, 3, - - -, 8) and an output of the main row decoder, and 70 indicates word line driving CMOS inverters each having an input connected to an output of one of the NOR gates 69.

Generally, since the pitch of the word lines 66 is relatively small in the NAND mask ROM, it becomes difficult to drive the individual word lines by use of the respective word line driving circuits when taking the pattern layout into consideration, and usually, the ROM is constructed to drive the two or four word lines by use of one word line driving circuit. Further, the word line driving circuit must be made simple in construction 10 when taking the pattern layout into consideration, and for this reason, the CMOS inverters 70 are used as the word line driving circuit. However, in this case, it becomes necessary to connect the NOR gates 69, which are used as the pre-drivers, at the preceding stage of the CMOS inverters.

Further, in order to reduce the number of contacts between the memory cell blocks 62 and bit lines 71 in the above NAND type mask ROM, each bit line contact is commonly shared by corresponding four of the memory cell blocks 62. In order to permit a desired one of the four memory cell blocks 62 to be selected, a block selection enhancement transistor 63 and depletion transistor 64 are serially connected between one end of each of the four memory cell blocks 62 and the bit line contact so that the other end of each of the four memory cell blocks 62 may be selectively connected to a ground node.

At the time of reading out data from the above NAND type mask ROM, if an output of the main row decoder 67 is set to the "L" level and one of the block selection signals $\phi$si (i=1, 2, 3, 4) is set to the low level "L" (the remaining three block selection signals are kept at the high level "H"), then an output of a corresponding one of the block selection NOR gates 68 (that is, one of the NOR gates 68 which is supplied with the block selection signal $\phi$si of "L" level) is set to the "H" level and outputs of the remaining three NOR gates 68 are kept at the "L" level. As a result, a corresponding one of the four memory cell blocks 62 sharing one bit line contact (that is, one of the memory cell blocks 62 which receives "H" and "L" level outputs from the corresponding NOR gates 68) is selected and the remaining three memory cell blocks 62 are not selected. When one of the word line selection signals $\phi$wi (i=1, 2, - - -, 8) is set to the "L" level (the remaining seven word line selection signals are kept at the "H" level), then an output of a corresponding one of the word line selection NOR gates 69 (that is, one of the NOR gates 69 which is supplied with the word line selection signal $\phi$wi of "L" level) is set to the "H" level and outputs of the remaining seven NOR gates 69 are kept at the "L" level. As a result, an output (selected output) of a corresponding one of the CMOS inverters 70 (that is, one of the CMOS inverters 70 which receives "H" and "L" level outputs from the corresponding NOR gates 69) is set to the "L" level and outputs (non-selected outputs) of the remaining seven CMOS inverters are kept at the "H" level.

Therefore, seven non-selected cells among the eight memory cells 61 in the selected memory cell block 62 are turned on and the remaining one selection cell is turned off or on according to whether it is of enhancement type or depletion type. As a result, a readout output of "H" or "L" level is derived from the selected memory cell block 62 according to the write-in data of the selected cell.

However, with the above construction, since the pattern area of the NOR gates 69, which are arranged at the preceding stage of the CMOS inverter and are also used as pre-drivers, and the pattern area of the output wiring region 72 for the NOR gates are relatively large, the area occupied by the row decoder on the chip becomes relatively large, thereby making it difficult to reduce the chip size.

As described above, when the conventional decoder circuit is constructed in such a pattern that decoder output lines may be driven by a plurality of CMOS inverters on the semiconductor chip, it is necessary to arrange pre-driver circuits at the preceding stage of the plurality of CMOS inverters, and as a result, the pattern areas of the pre-driver circuits and the output wiring region for the pre-driver circuits become relatively large and the area occupied by the decoder circuit on the semiconductor chip becomes large, thus making it difficult to reduce the chip size.

SUMMARY OF THE INVENTION

This invention has been made in view of the above problems, and an object of this invention is to provide a decoder circuit which is constructed in such a pattern that decoder output lines may be driven by a plurality of CMOS inverters on the semiconductor chip without arranging pre-driver circuits at the preceding stage of the plurality of CMOS inverters so as to make it unnecessary to use the pre-driver circuits and the output wiring region for the pre-driver circuits, thereby making it possible to significantly reduce the occupying pattern area thereof on the chip, reduce the chip size and lower the chip cost thereof.

A decoder circuit of this invention comprises a plurality of CMOS inverters formed on a semiconductor chip and supplied with decoder output line selection signals to respectively drive a plurality of decoder output lines; and a circuit for respectively applying high and low level potentials to two power source nodes of high and low potential sides in a mode in which the CMOS inverters are selected and applying the same potential to the two power source nodes in a mode in which the CMOS inverters are not selected.

Since the high and low level potentials are applied to the two power source nodes in the mode in which the CMOS inverters are selected, the CMOS inverters effect the normal operation to selectively drive the decoder output lines according to the decoder output line selection signals. On the other hand, in the mode in which the CMOS inverters are not selected, since the "H" or "L" level potential is applied to both of the two power source nodes, the decoder output lines are not selected.

As a result, it becomes unnecessary to arrange pre-driver circuits at the preceding stage of the CMOS inverters and it becomes possible to omit the output wiring region for the pre-drivers and significantly reduce the pattern area occupied by the decoder circuit on the chip, thus making it possible to reduce the chip size and lower the chip cost thereof.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a circuit diagram showing a second embodiment of a decoder circuit according to this invention; and FIG. 6 is a circuit diagram showing a CMOS inverter shown in FIG. 5.

DETAILED DESCRIPTION OF THE PREFERRED EMBODIMENTS

There will now be described an embodiment of this invention with reference to the accompanying drawings.

Figure 2:
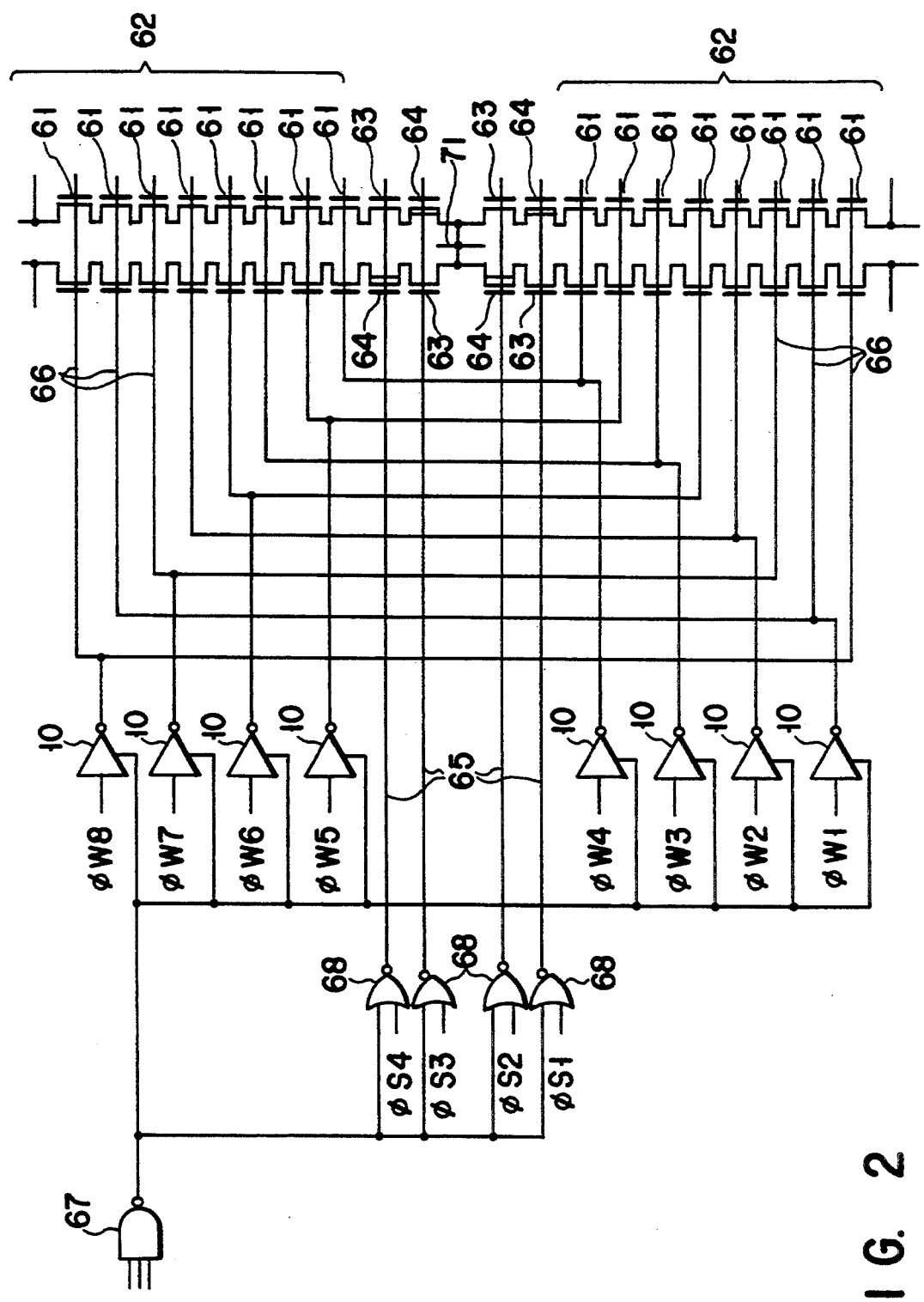
FIG. 2 is a circuit diagram showing a first embodiment of a decoder circuit according to this invention.

FIG. 2 is a circuit diagram showing part of a memory cell array and a decoder circuit used in a NAND type CMOS ROM as a first embodiment of this invention.

Like the conventional case described with reference to FIG. 1, this embodiment is constructed in such a pattern that word lines 66 may be driven by a plurality of CMOS inverters 10 on a semiconductor chip, but it is different from the conventional case in the following respects (a) and (b):

(a) The word line selection NOR gate group and the output wiring region therefor are omitted and input nodes of the word line driving CMOS inverters 10 are supplied with word line selection signals $\phi wi$ ($i=1, 2, --, 8$).

Figure 3:
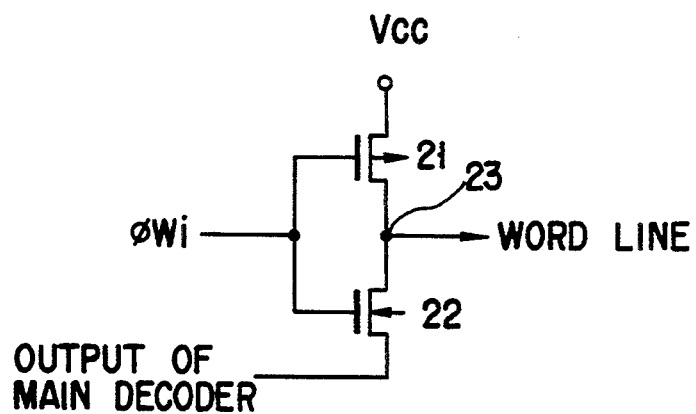
FIG. 3 is a circuit diagram showing a CMOS inverter shown in FIG. 2.

(b) The CMOS inverters 10 are applied with the "H" level potential at the high-potential side power source node and supplied with an output of the main row decoder at the low-potential side power source node. In other words, as shown in FIG. 3, a power source potential Vcc is applied to the source node of a P-channel MOS transistor 21 and an output of the main row decoder is supplied to the source node of an N-channel MOS transistor 22.

Figure 1:
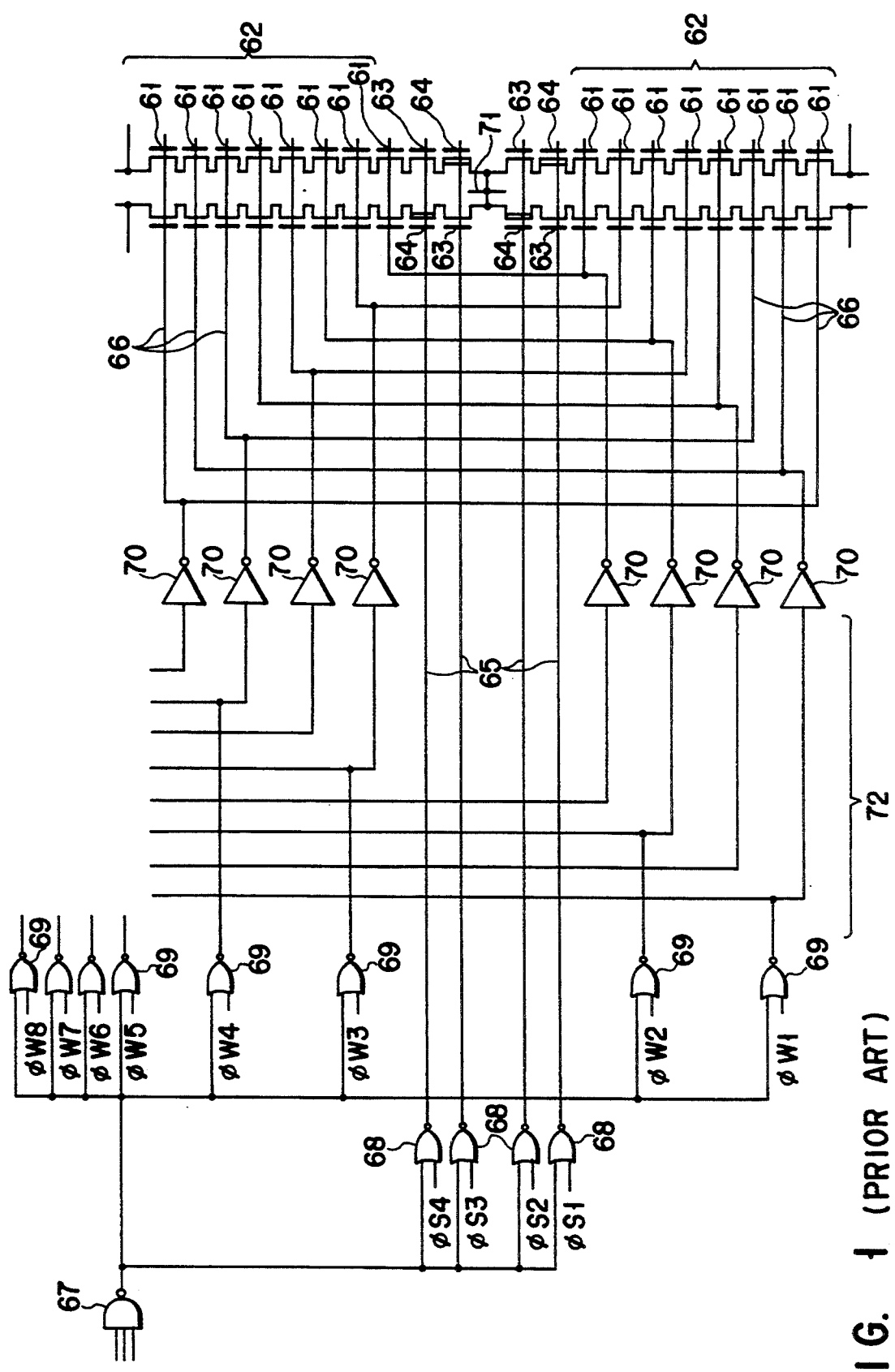
FIG. 1 is a circuit diagram mainly showing a row decoder in the conventional mask ROM.

The remaining portions are the same as those of the conventional case and the same portions are denoted by the same reference numerals as those used in FIG. 1. That is, 61 indicates memory cells each constructed by an enhancement or depletion MOS transistor corresponding to write-in data "1" or "0", 62 indicates memory cell blocks each having a plurality of memory cells (in this example, eight memory cells) connected to form a NAND logic circuit, 63 indicates block selecting enhancement MOS transistors, 64 indicates block selecting depletion MOS transistors, 65 indicates block selecting lines, 68 indicates a block selecting NOR gate to which one of block selection signals $\phi si$ ($i=1, 2, 3, 4$) and an output of the main row decoder are input, and 71 indicates a bit line.

At the time of reading out data from the above NAND type mask ROM, if an output of the main row decoder is set to the "L" level and one of the block selection signals $\phi si$ ($i=1, 2, 3, 4$) is set to the "L" level (the remaining three block selection signals are kept at the "H" level), then an output of a corresponding one of the block selection NOR gates 68 (that is, one of the NOR gates 68 which is supplied with the block selection signal $\phi si$ of "L" level) is set to the "H" level and outputs of the remaining three NOR gates 68 are kept at the "L" level as in the conventional case. As a result, a corresponding one of the four memory cell blocks 62 sharing one bit line contact (that is, one of the memory cell blocks 62 which receives "H" level output from the corresponding NOR gates 68) is selected and the remaining three memory cell blocks 62 are not selected.

At this time, since the low-potential side power source node of the CMOS inverters 10 is applied with an "L" level output of the main row decoder 67, the CMOS inverters 10 are set into the selected mode. That is, when one of the word line selection signals $\phi wi$ ($i=1, 2, --, 8$) is set to the "H" level (the remaining seven word line selection signals are kept at the "L" level), then an output (selected output) of a corresponding one of the CMOS inverters 10 (that is, one of the CMOS inverters 10 which is supplied with the word line selection signal $\phi wi$ of "H" level) is set to the "L" level and outputs (non-selected outputs) of the remaining seven CMOS inverters are kept at the "H" level.

Therefore, like the conventional case, seven non-selected cells among the eight memory cells 61 of the selected one of the memory cell blocks 62 are turned on and the remaining one selected cell is turned off or on according to whether it is of enhancement type or depletion type. As a result, a readout output of "H" or "L" level can be derived from the selected memory cell block 62 according to the write-in data of the selected cell.

Figure 4:
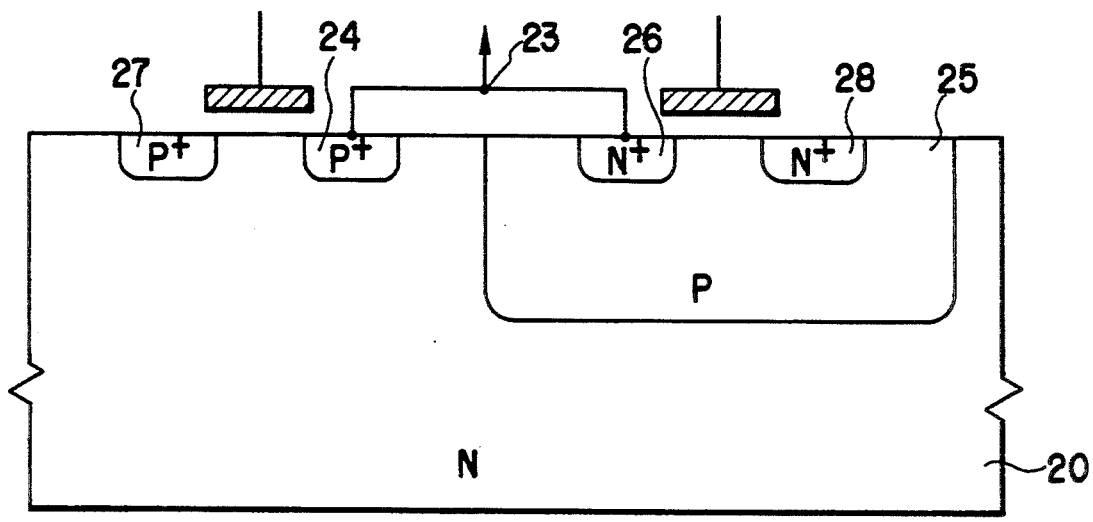
FIG. 4 is a cross sectional view showing the structure of the CMOS inverter of FIG. 3.

On the other hand, when the main row decoder output is set at the "H" level, the low-potential side power source node of the CMOS inverters 10 is applied with the "H" level potential and the CMOS inverters 10 are set into the non-selected state. At this time, if one of the word line selection signals $\phi$wi (i=1, 2, - - -, 8) is set to the "H" level (the remaining seven word line selection signals are kept at the "L" level), then the P-channel transistors 21 of the seven CMOS inverters 10 applied with the "L" level potential are turned on and the output nodes 23 thereof are set to the Vcc potential. In contrast, in one of the CMOS inverters 10 which is applied with the "H" level potential, the P-channel transistor 21 is turned off and the N-channel transistor 22 is turned on so that the output node 23 thereof will be set to (Vcc−VTHN) (VTHN is a threshold voltage of the N-channel transistor). When the word line 66 connected to the output node 23 is influenced by coupling noise or the like, the potential of the word line 66 may be set higher than (Vcc−VTHN). However, since the CMOS inverter 10 is formed with the construction as shown in FIG. 4, for example, and a drain region 24 for the P-channel transistor 21 in an N-type semiconductor conductor substrate 20 and a drain region 26 for the N-channel transistor 22 in a P well 25 are connected to each other to form the output node 23, the potential of the output node 23 can be prevented from being set higher than (Vcc+VF) (VF is a voltage drop in the junction area between the N-type semiconductor substrate 20 and the drain region 24 of the P-channel transistor) in a state in which a vcc potential is applied to a source region 27 for the P-channel transistor and a source region 28 for the N-channel transistor, that is, the CMOS inverters 10 are not selected.

As described in the above embodiment, according to the decoder circuit for selecting the memory cells of the memory cell blocks in the NAND type CMOS mask ROM, it is not necessary to provide pre-driver circuits at the preceding stage of the CMOS inverters 10, the output wiring region for the pre-driver circuits can be omitted, and the decoder circuit can be formed with a pattern area which is 60 to 70% of that of the conventional decoder circuit. As a result, the pattern area occupied on the chip dan be extremely reduced, thereby making it possible to reduce the chip size and lower the chip cost.

FIG. 5 is a circuit diagram showing a decoder circuit for selecting memory cells of the memory cell blocks in a NOR type mask ROM as the second embodiment. An example of a NOR type mask ROM for selecting the memory cells of the memory cell block in which the memory cells are connected to form a NOR logic circuit is disclosed in the SHARP Technical Report, No. 40, 1988, pp 71-75, "LARGE CAPACITY 16-Mb CMOS MASK ROM" Hotta et al.

In the decoder circuit of FIG. 5, the word line driving CMOS inverters 10 supplied with word line selection signals $\phi$wi (i=1, 2, - - -, 8) are applied with a ground potential Vss at the source node of the N-channel MOS transistor 22 as shown in FIG. 6 and the source node of the P-channel MOS transistor 21 is supplied with an output of the main row decoder. 65 indicates block selection lines for selecting block selecting transistors, 66 indicates memory cell selecting word lines, 41 indicates a main row decoder constructed by a NOR gate, 42 indicates a block selecting NAND gate supplied with one of the block selecting signals $\phi$si (i=1, 2, 3, 4) and an output of the main row decoder, and 43 indicates block selecting inverter circuits connected at the succeeding stage of the respective block selecting NAND gates 42.

At the time of reading out data from the NOR type mask ROM, if the row decoder output is set to the "H" level and one of the block selecting signals $\phi$si (i=1, 2, 3, 4) is set to the "H" level (the remaining block selecting signals are kept at the "L" level), then an output of a corresponding one of the block selecting NAND gates 42 (that is, one of the NAND gates which is supplied with a block selecting signal $\phi$si of "H" level) is set to the "L" level and the remaining outputs are kept at the "H" level. As a result, an output of a corresponding one of the block inverter circuits 43 (that is, one of the inverter circuits 43 which is supplied with the "L" level output from the NAND gate 42) is set to the "H" level to select a corresponding memory cell block (not shown) and the memory cell blocks which are supplied with the remaining outputs ("L" level) are not selected.

At this time, since the "H" level output of the main row decoder is applied to the source nodes of the P-channel transistors 21 of the CMOS inverters 10, the CMOS inverters 10 are set into the selected state. On the other hand, when one of the word line selecting signals $\phi$wi (i=1, 2, - - -, 8) is set to the "L" level (the remaining seven word line selecting signals are kept at the "H" level), an output (selected output) of a corresponding one of the CMOS inverters 10 (that is, one of the CMOS inverters 10 which is supplied with a word line selecting signal $\phi$wi of "L" level) is set to the "H" level and the remaining seven outputs (non-selected outputs) are kept at the "L" level.

Thus, seven non-selected cells among the eight memory cells (not shown) in the memory cell block are turned off and the remaining one selected cell is turned off or on according to write-in data "1" or "0". As a result, a readout output corresponding to the write-in data of the selected cell can be derived from the selected memory cell block.

On the other hand, when a main row decoder output is set at the "L" level, the source nodes of the P-channel transistors 21 of the CMOS inverters 10 are applied with the "L" level potential and the CMOS inverters 10 are set into the non-selected mode. At this time, if one of the word line selecting signals $\phi$wi (i=1, 2, - - -, 8) is set to the "H" level (the remaining seven word line selecting signals $\phi$wi are kept at the "L" level), the N-channel transistors 22 of the seven CMOS inverters 10 which are applied with the "H" level potential are set into the ON state and the output nodes 23 thereof are set to the ground potential Vss. In contrast, in one of the CMOS inverters 10 which is applied with the "L" level potential, the N-channel transistor 22 is set into the OFF state and the P-channel transistor 21 is turned on, and the output node potential is set to |VTHP| (VTHP is a threshold voltage of the P-channel transistor). In this case, there occurs a possibility that the potential of the word line 66 becomes lower than |VTHP| if the word line 66 connected to the output node 23 is influenced by coupling noise or the like. However, as is understood from the structure of the CMOS inverter 10 shown in FIG. 4, the potential of the output node 23 will not be set lower than −VF (VF is a voltage drop in the junction area between the P well 25 and the drain region 26 for the N-channel transistor) in a state in which ground potential Vss is applied to the source region 27 for the P-channel transistor and the source region 28 for the N-channel transistor, that is, the CMOS inverters 10 are not selected.

That is, like the decoder circuit of the first embodiment, in the decoder circuit of the second embodiment, it is not necessary to connect pre-driver circuits at the preceding state of the respective CMOS inverters and the output wiring region for the pre-driver circuits can be omitted to extremely reduce the pattern area occupied on the chip, thereby making it possible to reduce the chip size and lower the chip cost.

This invention is not limited to the mask ROM of the above embodiments and can be applied to various types of semiconductor memories and other integrated circuits.

As described above, according to the decoder circuit of this invention, when the decoder circuit is constructed in such a pattern construction that decoder output lines may be driven by a plurality of CMOS inverters on the semiconductor chip, it becomes unnecessary to arrange pre-driver circuits at the preceding stage of the respective CMOS inverters and the pattern areas of the pre-driver circuits and the output wiring region can be omitted to extremely reduce the area occupied on the chip, thereby making it possible to reduce the chip size and lower the chip cost.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
    a plurality of memory cell blocks arranged in pairs, each memory cell block including a plurality of memory cell transistors constituting a NOR-type mask ROM having gates which are coupled to word lines, each memory cell block further including a block selecting enhancement type MOS transistor and a block selecting depletion type MOS transistor connected in series with said memory cell transistors, wherein a gate of the block selecting enhancement type MOS transistor in one memory cell block of a given pair and a gate of the block selecting depletion type MOS transistor in the other memory cell block of said given pair are commonly connected to one of a plurality of block selection lines; and
    a decoder circuit for selecting one of said memory cells of one of said memory cell blocks by driving said block selection lines and said word lines, said decoder circuit comprising:
        a main decoder portion for outputting a main decoder portion output signal;
        block selection line drive logic having a plurality of input nodes applied with said main decoder portion output signal and block selection signals, for driving one of said block selection lines in accordance with said main decoder portion output signal and said block selection signals; and
        a plurality of CMOS inverters, each CMOS inverter comprising a P channel MOS transistor and an N channel MOS transistor, a source of said P channel MOS transistor applied with said main decoder portion output signal, a source of said N channel MOS transistor applied with a predetermined potential, gates of said P channel MOS transistor and said N channel MOS transistor connected to a corresponding one of a plurality of word line selection signal lines, and drains of said P channel MOS transistor and said N channel MOS transistor connected to a corresponding one of said word lines.

* * * * *